March 10, 1970 L. C. WETTERAU, JR., ET AL 3,500,144

RANDOM WHISKER CONTACT METHOD FOR SEMICONDUCTOR DEVICES

Filed Oct. 18, 1966 2 Sheets-Sheet 1

INVENTOR
Lin C. Wetterau, Jr.
Robert B. Owen

BY Robert J. Crawford
ATTORNEY

RANDOM WHISKER CONTACT METHOD FOR SEMICONDUCTOR DEVICES

Filed Oct. 18, 1966 2 Sheets-Sheet 2

3,500,144
RANDOM WHISKER CONTACT METHOD FOR SEMICONDUCTOR DEVICES

Lin C. Wetterau, Jr., Dallas, and Robert B. Owen, Richardson, Tex., assignors to Texas Instruments Incorporated, Dallas, Tex., a corporation of Delaware Filed Oct. 18, 1966, Ser. No. 587,570
Int. Cl. H01l 5/04, 5/00, 7/00
U.S. Cl. 317—236 11 Claims

ABSTRACT OF THE DISCLOSURE

A Schottky-barrier type diode is described in which a whisker contact orientation makes random contact to one of many diode components on a semiconductor substrate. The improved method eliminates the need for microscopically positioning the whisker contact.

When diodes such as the Schottky-barrier type are used in microwave applications, the junction and package capacitances of the diode become of paramount concern. Since the capacitance of the diode is directly related to the size of the junction, diode configurations for high frequency applications are of extremely small size, being in the range of 3 millinches or less in diameter. Because of this small size, making contact to the anode of the diode is extremely difficult. The usual ball bonding techniques cannot be used due to the relative size of the wire and ball bonded joint as compared to the size of the anode itself. Therefore a whisker contact is highly desirable and is made to the metallic anode, thereby to form an ohmic contact which takes no part in the diode action of the device. The manufacturing yields of these extremely small microwave diodes are very low due to the inherent difficulty in positioning the whisker point in relationship to the anode. In addition, the manufacturing cost is increased due to the necessity of microscopically positioning the whisker.

With these difficulties in mind it is an object of this invention to provide an improved method of forming a whisker contact to a diode which eliminates the need for microscopically positioning the whisker contact.

Another object of the invention is to form a diode with a whisker contact orientation that makes random contact to one of many diode components on a semiconductor substrate, thus eliminating the need for precise whisker contact position control during manufacturing.

A further object of the invention is to provide a method of whisker contact orientation to randomly make contact to a diode among a plurality of diodes in a single substrate, thereby to increase the manufacturing yield.

The novel features believed to be characteristic of the invention are set forth with particularity in the appended claims. The invention itself, however, as well as further objects and advantages thereof may best be understood by reference to the following detailed description of a preferred embodiment, when read in conjunction with the accompanying drawings, wherein:

Briefly, the invention involves an improved method of forming the anode contact of a diode by the use of the whisker contact method, and although the invention is herein described and illustrated as applying to a Schottky-barrier diode, it is obvious that the invention equally applies to diodes having diffused junctions. Accordingly, in an embodiment of the invention a plurality of diodes are fabricated in a wafer of silicon material. The wafer is alloyed to a cathode support by the use of a metal preform. The cathode support is attached to a lead having a lead extension previously sealed to one end of a glass tube with the cathode support extending into the tube and the lead extending out from the glass-to-lead seal. The anode lead with an attached whisker is placed inside the tube through the opening opposite the previously sealed end of the glass tube. The point of the whisker now makes contact to any one of the diode anodes in the wafer or to the insulated area between each diode. The grouping of the diodes is such that the combined area of the anodes, when compared to the total area of the wafer and the relationship of the whisker point diameter to the dimension of the insulation space between anodes causes the ratio of the effective anode contact area to the total area of the wafer to be quite large. Therefore, by randomly making contact between the point of the whisker and the wafer without any purposeful orientation, the chance of making contact to an anode rather than to an insulating area is quite high. The diameter of the whisker point is slightly less than the distance between adjacent anodes, thus preventing the whisker point from making contact with more than one diode. A seal is then made between the open end of the glass tube and the anode lead to form a hermetic package. Using this method, the yield is much greater than can be obtained by precisely locating a whisker point microscopically on a wafer containing a single diode component, and attempting to hold that whisker contact throughout the manufacturing operation until the final seal is made.

Figure 1:
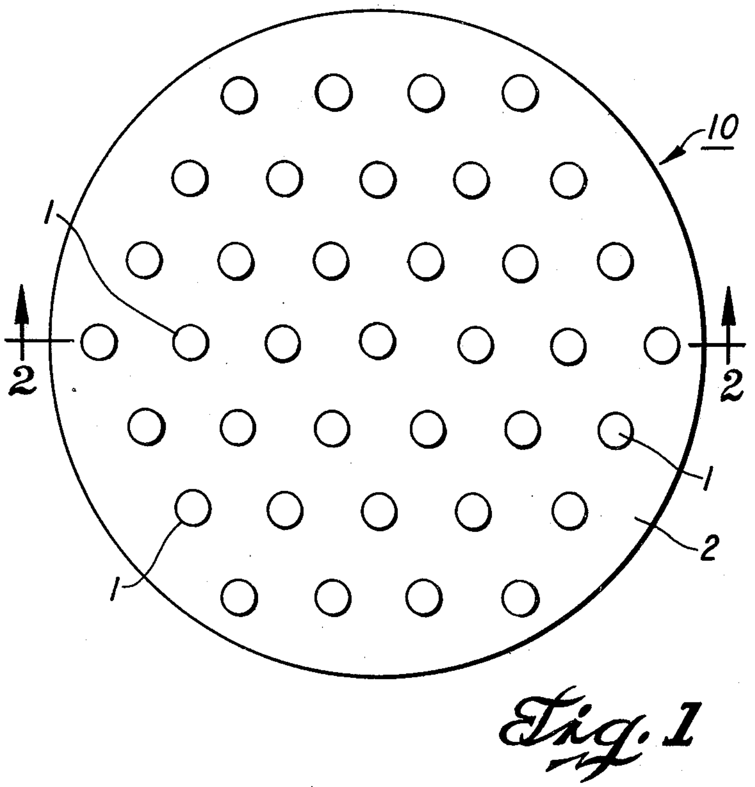
FIGURE 1 is a top view of a semiconductor wafer having thereon, for example, a number of Schottky-barrier diode components.

Referring now to the figures of the drawings, FIGURE 1 shows the top view of a semiconductor wafer 10, for example, silicon, containing a plurality of Schottky-barrier diodes 1. The diodes 1, being of the order of 2.5 millinches in diameter are precisely positioned on the silicon wafer 2 such that each diode 1 is on a 7 millinch center from each adjacent diode. This spacing allows an insulating space between adjacent diodes of 4.5 millinches. The dimensions given are by way of illustration only and can be varied to obtain the desired parameters of each diode and the desired diode packing density of the wafer.

Figure 2:
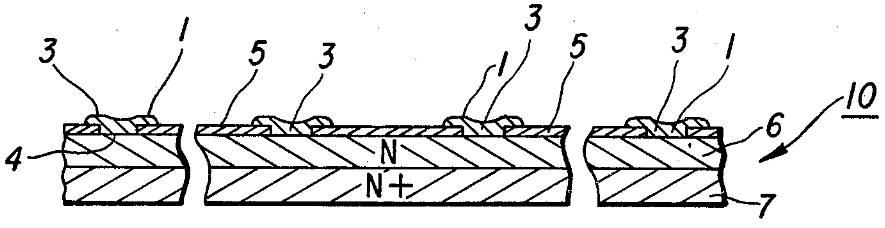
FIGURE 2 is a sectional view of the semiconductor wafer of FIGURE 1 taken along the section line 2—2 of FIGURE 1, with a part broken away to indicate an omitted portion of the wafer.

FIGURE 2 is a sectional view of a portion of a silicon semiconductor wafer 10 with a plurality of planar Schottky-barrier diodes 1 as indicated in FIGURE 1, and fabricated thereon according to the method disclosed in patent application Ser. No. 397,413, filed Sept. 18, 1964 by Warrent Waters, entitled Planar Schottky Barrier and assigned to Texas Instruments Incorporated, the assignee of the present application. The anode 3 of each diode 1 is composed of a metal layer of a metal such as molybdenum which forms a barrier at the interface 4 of the epitaxial layer 6. Each diode 1 is separated from an adjacent diode 1 by an insulating layer 5 of a material such as silicon oxide. The diode structure is built upon an N conductivity type layer 6 epitaxially deposited upon an N+ conductivity type substrate 7.

Figure 3:
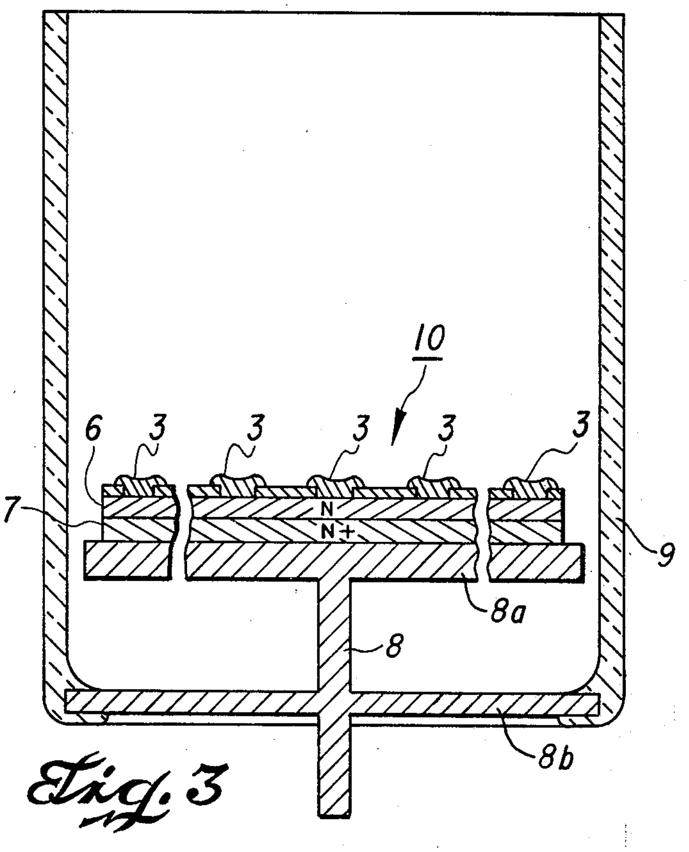
FIGURE 3 is a sectional view of a semiconductor wafer with a plurality of Schottky-barrier diode components thereon, showing the wafer attached to a cathode support, with a part broken away to indicate an omitted portion of the wafer.

Wafer 10, containing a number of Schottky-barrier diode components is alloyed down to the cathode support *8a*, as shown in FIGURE 3, by the use of a suitable alloying metal preform. The cathode support *8a* is, preferably, an extension of the cathode lead 8, and is formed as an integral part of the lead 8 during a previous lead forming operation. The cathode lead 8, in addition to having the cathode support 8a, has a cathode sealing extension 8b which is previously sealed by a conventional furnace or flame sealing operation to one end of an open glass tube 9. The glass sealing operation forms a hermetic seal between the cathode lead 8 and the glass tube 9, whereby the cathode support 8a extends into the glass tube and the lead 8 extends out from the glass to be used later for making a circuit connection. The cathode lead 8 and glass tube 9 can be made of a number of different combinations of materials; however, for most quality applications, the combination of a nickel-cobalt-iron alloy (such as Kovar made by Westinghouse Corporation) and a borosilicate glass (such as Corning 7052 made by Corning Glassworks) is commonly used.

Figure 4:
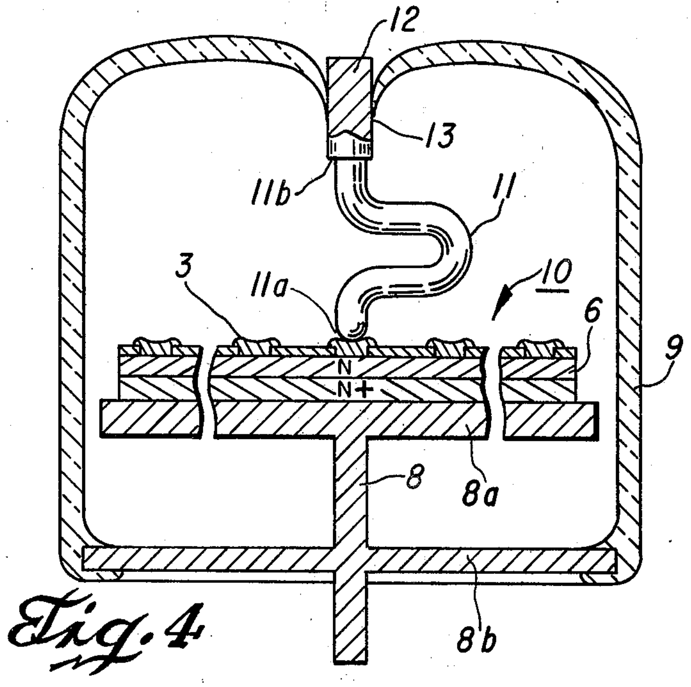
FIGURE 4 is a sectional view of a packaged Schottky-barrier diode according to the invention with a part broken away to indicate omitted portions of the wafer.

As shown in FIGURE 4, an anode whisker 11 is formed in the shape of an up-ended hair-pin to give it a spring effect. One end 11a of the whisker is etched to form a point with a diameter slightly less than the dimension of the insulating space between adjacent diode anodes, thereby preventing the whisker from making contact to more than one diode, but increasing the possibility of contacting one diode beyond that which would be obtained by a sharp point contact. The opposite end 11b of the whisker is attached, usually by welding, to the anode lead 12 which is made from the same material as the cathode lead 8. The whisker can be made of a number of metallic materials but is commonly fabricated from tungsten. The assembled anode lead 12 and whisker 11 is randomly placed within the open end of the glass tube 9. No microscope positioning is required to locate the point 11a of the whisker on the anode of any particular diode. The whisker point is simply placed on the wafer surface.

Due to the extremely close packing of the plurality of active components upon each wafer 10 and the controlled size of the whisker point 11a, the chance of the whisker point making contact with one diode component on the wafer is extremely high. For example, finished diode devices have been fabricated by the method of this invention in which the yield was 90%. This 90% yield is much higher than can be obtained in the conventional single component method of forming Schattky-barrier diodes for microwave applications where the diode configuration must be extremely small. In the conventional single component method, it will be recalled that the contact point of the whisker must be positioned in contact with the anode of the single diode on the wafer by the aid of a microscope, with the contact having to be mechanically maintained upon the surface of the anode until the whisker assembly can be permanently sealed to the rest of the structure. Due to the strong possibility of the whisker point moving off of the anode of a single diode, many devices are lost during the manufacturing process.

Regardless of how the multiple diode assembly is handled during the manufacturing process, the yield of the packaged device using the method of this invention (disregarding other yield losses not due to the whisker orientation such as glass-to-metal seal leaks, which will be the same for both the single or multiple component technique) is determined solely by the statistical relationship between the combined anode areas and the radius of the whisker contact to the total wafer area.

To form the final glass seal of the open end of the glass tube 9 to the anode lead 12, the sealed cathode assembly represented by the numerals 8, 9 and 10 and the anode assembly 11 and 12 are positioned within a heating apparatus (not shown) and the anode lead 12 sealed to the open end of the glass tube 9, as shown in FIGURE 4 at the area 13. The packaged Schattky-barrier diode is now ready for electrical measurements, after which any packaged diode where the whisker 11 does not make contact with an anode 3 of a diode is rejected. It will be observed that the only diode in the package that is electrically useful is the one whose anode 3 is engaged by the whisker 11. All others, although contained in the package, remain functionless. It will also be noted that, as opposed to the manufacturing method of a whisker contact diode using a single diode component upon the substrate, the diode structure 10 does not require electrical testing before the sealing operation.

While the invention has been described with reference to a specific method and embodiment, it is to be understood that this description is not to be construed in a limiting sense. Various modifications of the invention will become apparent to persons skilled in the art without departing from the spirit and scope of the invention as defined by the appended claims.

What is claimed is:

1. A packaged semiconductor diode comprising:

(a) a semiconductor substrate containing a plurality of diode components in one surface of said substrate, (b) a first lead bonded to the opposite surface of said substrate, (c) a wire whisker in a spring like configuration making contact with one of said components, (d) a second lead bonded to said wire whisker, and (e) a glass tube bonded to said first lead and said second lead thereby forming a hermetic seal.

2. The packaged semiconductor diode as described in claim 1 wherein the plurality of diode components are separated from each other by an insulating layer.

3. A packaged semiconductor device comprising:

(a) a semiconductor substrate having a plurality of spaced semiconductor components formed adjacent one surface of said substrate and a layer of insulation between said components, each of said components being insulated from one another by said insulation and each has a conductive region that extends from said substrate through a respective opening in said insulation;

(b) at least one wire whisker having spring-like characteristics in random contact with one of said conductive regions of one of said components; and (c) insulating means for holding said one wire whisker in position relative to said one conductive region.

4. A packaged semiconductor diode comprising:

(a) a semiconductor substrate having a layer of insulation on one of its surfaces and a plurality of spaced semiconductor devices formed adjacent said one surface of said substrate, each of said devices being insulated from one another by said insulation and each having an anode that extends to said substrate through a respective opening in said insulation;

(b) a first lead bonded to the other surface of said substrate forming a common cathode for said semiconductor devices;

(c) at least one non-linear wire whisker having spring-like characteristics in random contact with one of said anodes of said devices;

(d) a second lead bonded to said wire whisker; and (e) an insulating tube bonded to said pair of leads so as to hold said leads in a desired position, compress said wire whisker firmly against said one anode, and hermetically seal said devices.

5. The packaged semiconductor device of claim 4 wherein the outer surface of said anodes are substantially coplanar, and the plane of said outer surfaces is slightly further remote from said substrate than is the plane of the outer surface of said insulation.

6. The packaged semiconductor device of calim 4 wherein the space between any two anodes of said devices is greater than the diameter of said wire whisker.

7. A method of fabricating a packaged semiconductor diode in a semiconductor substrate having a layer of insulation on one surface thereof, comprising the steps of:

(a) fabricating a plurality of similar semiconductor components in said one surface of said substrate, said components being separated from one another by said insulating layer, (b) connecting one end of a first lead to the opposite surface of said substrate, (c) sealing said first lead to one end of a glass tube whereby said one end of said first lead extends within said glass tube and the other end of said first lead extends outside of said glass tube, (d) connecting a wire whisker to a second lead, said wire whisker having a point contact at one end thereof of less diameter than the component separation, (e) randomly applying said point contact of said wire whisker to said one surface of said substrate, whereby said point contact engages one of said components, and (f) sealing said second lead to the opposite end of said glass tube whereby said second lead extends outside of said sealed glass tube.

8. A method of fabricating a semiconductor device in a substrate having a layer of insulation on one surface hereof, comprising the following steps:

(a) forming a plurality of spaced similar semiconductor components adjacent said one surface of said substrate, said components being insulated from one another by said insulation, wherein adjacent diodes are spaced approximately 7 millinch on centers;

(b) placing at least one wire whisker in random contact with a respective one of said components; and (c) securing said wire whisker in position relative to said respective component to form said semiconductor device.

9. The method of claim 8 wherein the outer surfaces of said components are substantially co-planar, and the plane of said outer surfaces is slightly further remote from said substrate than is the plane of the outer surface of said insulation.

10. The method of claim 8 wherein the space between any two components is slightly greater than the diameter of said wire whisker.

11. A method of fabricating a packaged semiconductor diode, comprising the following steps:

(a) coating a semiconductor substrate with a layer of insulating material;

(b) forming a plurality of spaced, substantially similar semiconductor devices adjacent one surface of said substrate with each device being insulated from one another by said insulation and each having an anode that extends to said substrate through a respective opening in said insulation;

(c) securing a first lead to the other surface of said substrate to produce a common cathode for said devices;

(d) placing at least one non-linear wire whisker having spring-like characteristics in random contact with a respective one of said anodes of said devices;

(e) securing a second lead to said wire whisker; and (f) securing an insulating tube to said first and second leads so as to hold said leads in a desired position, compress said wire whisker firmly against said one anode, and hermetically seal said devices, thereby producing said diode.

References Cited

UNITED STATES PATENTS

| | | | |
|---|---|---|---|
| 2,736,847 | 2/1956 | Barnes | 317—234 |
| 3,360,851 | 2/1968 | Kahng | 29—590 |

JAMES D. KALLAM, Primary Examiner

M. H. EDLOW, Assistant Examiner

U.S. Cl. X.R.

29—587; 317—234